United States Patent
Nuetzel et al.

(10) Patent No.: US 6,784,091 B1
(45) Date of Patent: Aug. 31, 2004

(54) MASKLESS ARRAY PROTECTION PROCESS FLOW FOR FORMING INTERCONNECT VIAS IN MAGNETIC RANDOM ACCESS MEMORY DEVICES

(75) Inventors: Joachim Nuetzel, Kulmback (DE); Christian Arndt, Wappinger Falls, NY (US); Greg Costrini, Hopewell Junction, NY (US); Michael C. Gaidis, Wappinger Falls, NY (US); Xian Jay Ning, Shanghai (CN)

(73) Assignees: International Business Machines Corporation, Armonk, NY (US); Infineon Technologies, AG, Munich (DE)

(*) Notice: Subject to any disclaimer, the term of this patent is extended or adjusted under 35 U.S.C. 154(b) by 0 days.

(21) Appl. No.: 10/250,133

(22) Filed: Jun. 5, 2003

(51) Int. Cl.[7] .............................................. H01L 21/28
(52) U.S. Cl. ...................... 438/618; 438/620; 438/622; 438/626; 438/629; 438/631; 438/637; 438/696; 438/700
(58) Field of Search ................................ 438/618, 620, 438/622, 626, 627, 629, 631, 637, 638, 639, 640, 696, 700, FOR 355

(56) References Cited

U.S. PATENT DOCUMENTS

| | | | |
|---|---|---|---|
| 5,496,759 A | | 3/1996 | Yue et al. |
| 6,048,739 A | * | 4/2000 | Hurst et al. ................... 438/3 |
| 6,174,737 B1 | | 1/2001 | Durlam et al. |
| 6,201,259 B1 | | 3/2001 | Sato et al. |
| 6,242,770 B1 | | 6/2001 | Bronner et al. |
| 6,269,018 B1 | | 7/2001 | Monsma et al. |
| 6,358,756 B1 | | 3/2002 | Sandhu et al. |
| 6,365,286 B1 | | 4/2002 | Inomata et al. |
| 6,379,978 B2 | | 4/2002 | Goebel et al. |
| 6,392,922 B1 | | 5/2002 | Liu et al. |
| 6,417,561 B1 | | 7/2002 | Tuttle |
| 6,440,753 B1 | * | 8/2002 | Ning et al. .................... 438/3 |
| 6,555,858 B1 | * | 4/2003 | Jones et al. .................. 257/295 |
| 2002/0012267 A1 | | 1/2002 | Okazawa |
| 2002/0098676 A1 | * | 7/2002 | Ning et al. ................... 257/329 |
| 2002/0121662 A1 | * | 9/2002 | Rosner et al. ............... 257/329 |
| 2002/0149962 A1 | * | 10/2002 | Fumio ........................ 365/173 |
| 2003/0073251 A1 | * | 4/2003 | Ning ............................. 438/3 |
| 2003/0146515 A1 | * | 8/2003 | Takeshi ....................... 257/758 |

* cited by examiner

Primary Examiner—George Fourson
Assistant Examiner—Joannie Adelle Garcia
(74) Attorney, Agent, or Firm—Sean Sullivan; Cantor Colburn, LLP; Margaret A. Pepper (57) ABSTRACT

A method for forming interconnect structures in a magnetic random access memory (MRAM) device includes defining an array of magnetic tunnel junction (MTJ) stacks over a lower metallization level. A encapsulating dielectric layer is formed over the array of MTJ stacks and the lower metallization level. Then, a via opening is defined in the encapsulating dielectric layer, and a planar interlevel dielectric (ILD) layer is deposited over the encapsulating dielectric layer and within the via opening. Openings are then formed within ILD layer, over the array of MTJ stacks and the via opening.

20 Claims, 10 Drawing Sheets

MASKLESS ARRAY PROTECTION PROCESS FLOW FOR FORMING INTERCONNECT VIAS IN MAGNETIC RANDOM ACCESS MEMORY DEVICES

BACKGROUND OF INVENTION

The present invention relates generally to magnetic memory devices and, more particularly, to a maskless array protection (AP) process flow that enables formation of interconnect vias and self-aligned contact to magnetic random access memory (MRAM) devices.

Magnetic (or magneto-resistive) random access memory (MRAM) is a non-volatile random access memory technology that could potentially replace the dynamic random access memory (DRAM) as the standard memory for computing devices. The use of MRAM as a non-volatile RAM will eventually allow for "instant on" systems that come to life as soon as the system is turned on, thus saving the amount of time needed for a conventional PC, for example, to transfer boot data from a hard disk drive to volatile DRAM during system power up.

A magnetic memory element (also referred to as a tunneling magneto-resistive, or TMR device) includes a structure having ferromagnetic layers separated by a non-magnetic layer (barrier), and arranged into a magnetic tunnel junction (MTJ). Digital information is stored and represented in the memory element as directions of magnetization vectors in the magnetic layers. More specifically, the magnetic moment of one magnetic layer (also referred to as a reference layer) is fixed or pinned, while the magnetic moment of the other magnetic layer (also referred to as a "free" layer) may be switched between the same direction and the opposite direction with respect the fixed magnetization direction of the reference layer. The orientation of the magnetic moment of the free layer are also known "parallel" and "antiparallel" states, wherein a parallel state refers to the same magnetic alignment of the free and reference layers, while an antiparallel state refers to opposing magnetic alignments therebetween.

Depending upon the magnetic state of the free layer (parallel or antiparallel), the magnetic memory element exhibits two different resistance values in response to a voltage applied across the tunnel junction barrier. The particular resistance of the TMR device thus reflects the magnetization state of the free layer, wherein resistance is "low" when the magnetization is parallel, and "high" when the magnetization is antiparallel. Accordingly, a detection of changes in resistance allows a MRAM device to provide information stored in the magnetic memory element (i.e., a read operation). In addition, a MRAM cell is written to through the application a bi-directional current in a particular direction, in order to magnetically align the free layer in a parallel or antiparallel state.

A practical MRAM device integrates a plurality of magnetic memory elements with other circuits such as, for example, control circuits for the magnetic memory elements, comparators for detecting the states in the magnetic memory elements, input/output circuits and miscellaneous support circuitry. As such, there are certain microfabrication processing difficulties to be overcome before high capacity/density MRAM products become commercially available. For example, in order to reduce the power consumption of the device and provide the variety of support functions CMOS technology is required. As is known in the art, various CMOS processing steps (such as annealing implants) are carried out at relatively high temperatures (e.g., in excess of 300Â° C.). On the other hand, ferromagnetic materials employed in the fabrication of MRAM devices, such as CoFe and NiFeCo for example, require substantially lower process temperatures in order to prevent intermixing of magnetic materials. Thus, the magnetic memory elements are designed to be integrated into the back end wiring structure following front end CMOS processing.

Magnetic memory elements contain components that are easily oxidized and also sensitive to corrosion. To protect magnetic memory elements from degradation and ensure the performance and reliability of the MRAM device, it is desirable to form a passivation layer thereupon. In addition, a magnetic memory element includes very thin layers, some on the order tens of angstroms thick. Because the performance of the magnetic memory element is particularly sensitive to the surface conditions on which magnetic layers are deposited, it is desirable to maintain an atomically flat surface to prevent degradation of the MRAM device characteristics.

Notwithstanding the above described processing variations between ferromagnetic materials and conventional DRAM elements, it is nonetheless desirable to simplify the MRAM fabrication process and increase the compatibility thereof with conventional back-end-of-line (BEOL) metallization process sequences. The BEOL metallization process sequence commonly utilizes copper as the metallic conductor, but is not limited to this conductor material. Wiring features are formed by filling etched recesses in the interlevel dielectric (ILD) with metal and removing the extraneous metal by polishing the wafer to a flat surface leaving the filled features separated by ILD. The mesa structure of the fabricated MTJ device results in a step height differential between the MTJ device array and surrounding support area. For a variety of reasons, it is important to maintain the planarity of each level of back end wiring, and the array step height necessitates an additional planarization step before the next metallization level is formed. It is highly desirable to reduce the cost and seamlessly integrate the MRAM array and support structure into a back end wiring process. Moreover, this also requires the MRAM process to be compatible with low dielectric constant (low-k) interlevel dielectric materials.

In general, the material chosen to encapsulate the MTJ device may not be the ILD material used to support the BEOL wiring structure. Prior art teaches a fabrication method that separates the array region comprising the MTJ storage devices and the surrounding support area. While the prior art is a workable method, there are cost and performance issues associated therewith, as addressed hereinafter.

SUMMARY OF INVENTION

The foregoing discussed drawbacks and deficiencies of the prior art are overcome or alleviated by a method for forming interconnect structures in a magnetic random access memory (MRAM) device. In an exemplary embodiment, the method includes defining an array of magnetic tunnel junction (MTJ) stacks over a lower metallization level. An encapsulating dielectric layer is formed over the array of MTJ stacks and the lower metallization level. Then, a via opening is defined in the encapsulating dielectric layer, and a planar interlevel dielectric (ILD) layer is deposited over the encapsulating dielectric layer and within the via opening. Openings are then formed within ILD layer, over the array of MTJ stacks and the via opening.

In another aspect, a method for forming back end of line (BEOL) interconnect structures in a magnetic random access memory (MRAM) device includes defining an array of magnetic tunnel junction (MTJ) stacks over a lower metallization level. A first dielectric layer is formed over the array of MTJ stacks and the lower metallization level. Thereafter, the first dielectric layer is planarized down to the top of the MTJ stacks. A via opening is then defined in the first dielectric layer, thereby exposing a portion of said lower metallization layer. A second dielectric layer is formed over the first dielectric layer and over the exposed portion of said lower metallization layer. Then, a planar interlevel dielectric (ILD) layer is deposited over the second dielectric layer, and openings are formed within the ILD layer, over the array of MTJ stacks and the via opening.

In still another aspect, a method for forming back end of line (BEOL) interconnect structures in a magnetic random access memory (MRAM) device includes defining an array of magnetic tunnel junction (MTJ) stacks over a lower metallization level. A passivation layer is formed over the array of MTJ stacks and the lower metallization level. An encapsulating dielectric layer is then formed over the passivation layer, the encapsulating dielectric layer and the passivation layer being planarized to the top of the MTJ stacks. A dielectric mask layer is formed over the passivation layer, the encapsulating dielectric layer and the MTJ stacks, and a via opening is defined in the dielectric mask layer, thereby exposing a portion of the encapsulating dielectric layer. Then, a planar interlevel dielectric (ILD) layer is deposited over the dielectric mask layer, and openings are formed within the ILD layer and over the array of MTJ stacks and the via mask openings.

BRIEF DESCRIPTION OF DRAWINGS

Referring to the exemplary drawings wherein like elements are numbered alike in the several Figures.

DETAILED DESCRIPTION

Figure 1A:
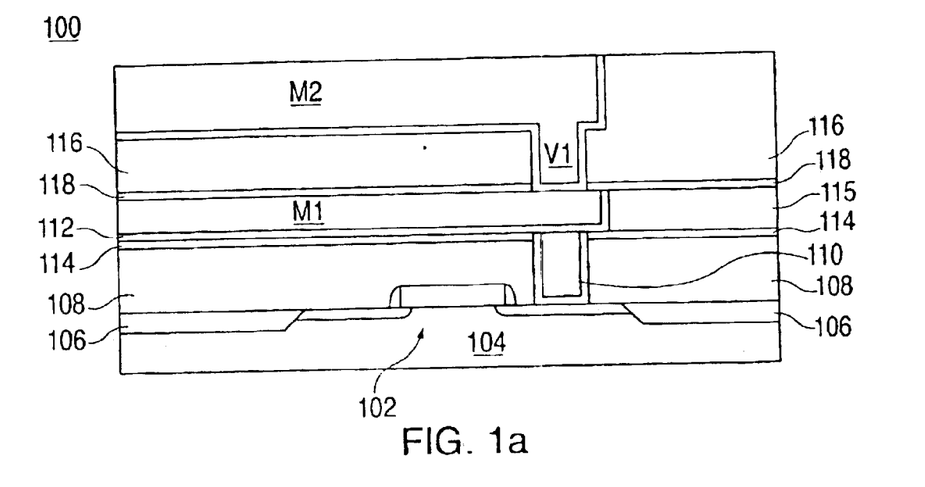
FIGS. 1(a) through 1(i) illustrate an existing process for implementing via integration following the formation of the MTJ stacks of an MRAM device, in which a masked array protection step is used.

Referring initially to FIGS. 1(a) through 1(i), there is illustrated an existing process for implementing via integration following the formation of the MTJ stacks of an MRAM device. FIG. 1(a) illustrates the formation of an MRAM structure 100 up to the second level of metallization, in accordance with well known fabrication processes. The lower level or front end of line (FEOL) structures, include transistor device 102 formed upon a silicon or other suitable substrate 104, along with isolation regions 106. An interlevel dielectric layer 108, such as doped silicon dioxide, is used to insulate the active substrate devices (e.g., transistor 102) from a first metallization layer M1, except where the transistor 102 is connected to M1 by contact via feature 110.

The first metallization layer M1 is formed within a liner or barrier layer 112 such as, for example, tantalum/tantalum nitride. The first metallization level may or may not be formed upon a nitride layer 114 covering the first interlevel dielectric (ILD) layer 108 and via contact feature 110. A second interlevel dielectric layer 115 is also formed upon nitride layer 114. Further, a second metallization layer M2 (and liner) is formed upon a third interlevel dielectric layer 116, wherein electrical contact between the first and second metallization layers M1, M2 is achieved through via V1. As with the second interlevel dielectric layer 115, the third interlevel dielectric layer 116 is also formed upon a nitride layer 118.

Those skilled in the art will appreciate that the first metallization layer M1, as well as the combination of via V1 and second metallization layer M2, may be formed by, for example, by conventional damascene processing and dual damascene processing, respectively. It will also be appreciated that the aforementioned FEOL structures (denoted collectively by 120 in subsequent Figures) are presented by way of example only, and are thus not discussed in further detail hereinafter.

Figure 1B:
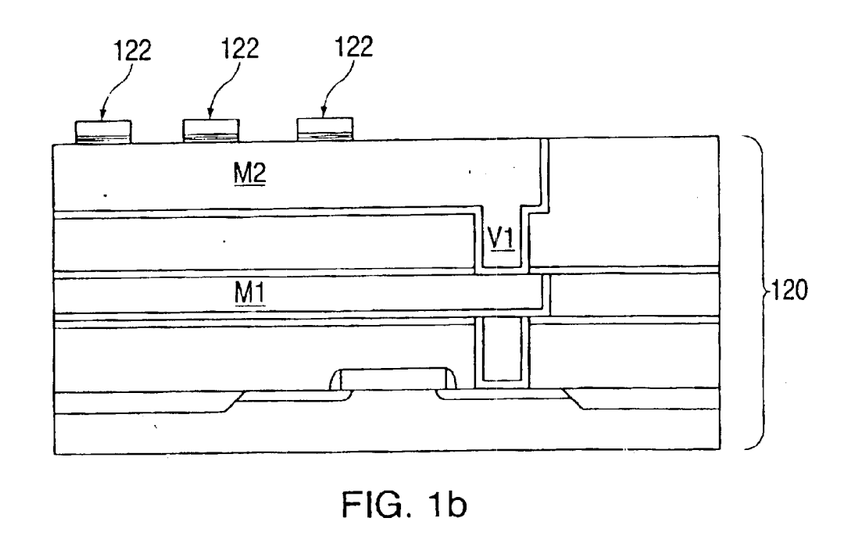
Figure 1C:
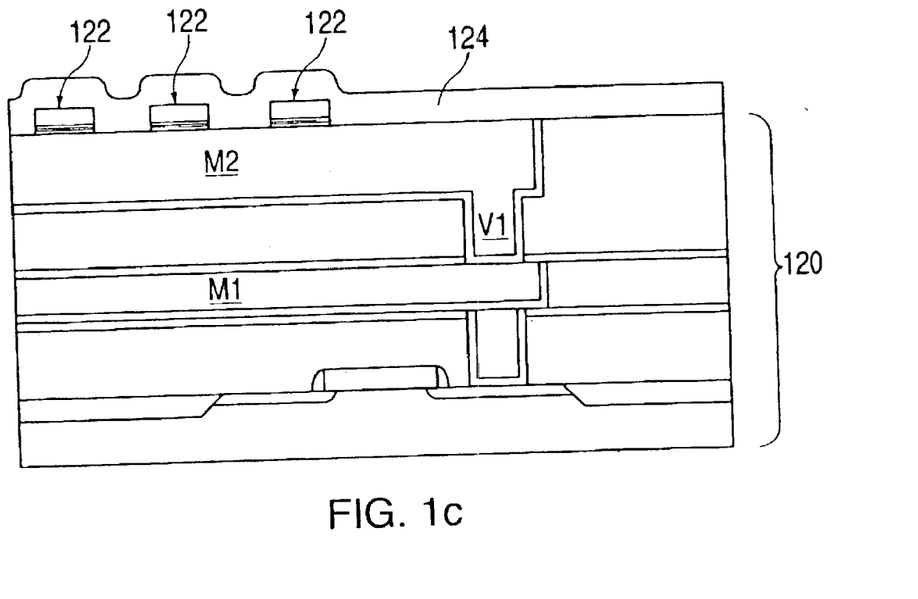
Figure 1D:
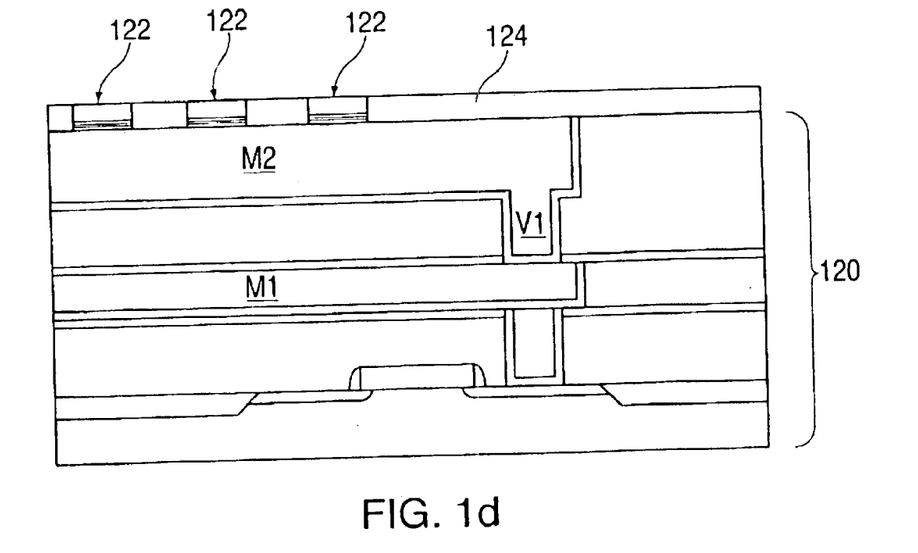
Figure 1E:
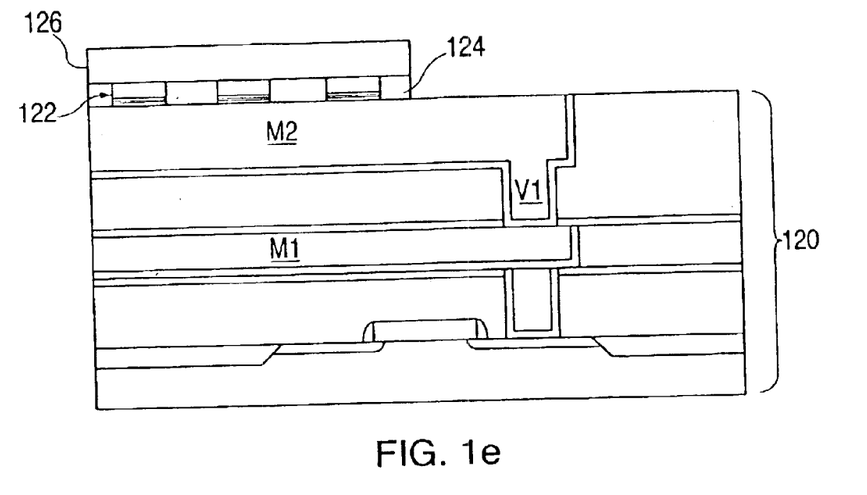

FIG. 1(b) illustrates the formation of a plurality of MTJ stacks 122, comprising a buffer layer, pinning layer, bottom pinned ferromagnetic layer, a tunnel barrier layer and top free ferromagnetic layer deposited over the second metallization level M2. A additional hardmask layer is deposited to provide an etch mask during the metal etching process for the MTJ stack. The example shown here utilizes silicon dioxide, which is subsequently removed during the wiring trench etch process, selective to the silicon nitride MTJ stack encapsulation. However, other hardmask materials, such as titanium nitride or tantalum nitride may also be used. If other dielectric materials are used as the hardmask material, then such material should have etch selectivity with respect to a subsequent encapsulating dielectric formed thereupon. It should also be noted at this point that the MTJ stacks need not necessarily be formed upon M2, and could also be formed upon M1 or on a metallization level above M2. Once the MTJ stacks 122 are formed, a blanket nitride layer 124 (encapsulating dielectric) is deposited thereupon, as shown in FIG. 1(c), and thereafter planarized down to the top of the MTJ stacks 122, as shown in FIG. 1(d).

At this point during the conventional processing, an array protection sequence is employed to protect the MRAM array elements (i.e., the MTJ stacks 122) during the formation of the next metallization level, as well as the vias connecting thereto from M2. Thus, referring now to FIG. 1(e), there is shown an array protection (AP) lithography step in which a photoresist layer 126 is applied and exposed over the array region and the unmasked region of nitride layer 124 thereunder are removed from the non-array areas. However, in so doing, there is a non-planar step height that results from the removal of nitride layer 124, and upon which a subsequent nitride layer 128 and a fourth ILD (oxide) layer 130 are formed in preparation for the next metallization level.

Figure 1F:
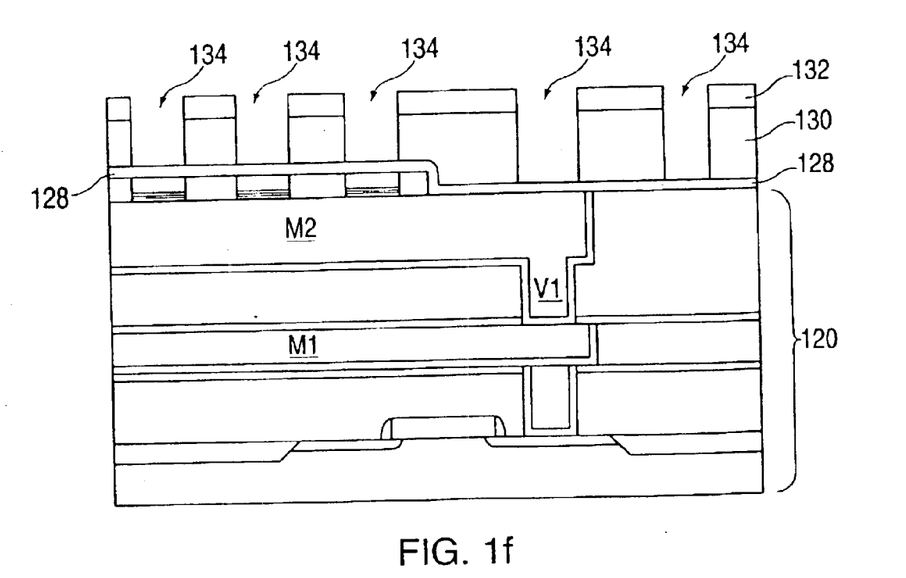
Figure 1G:
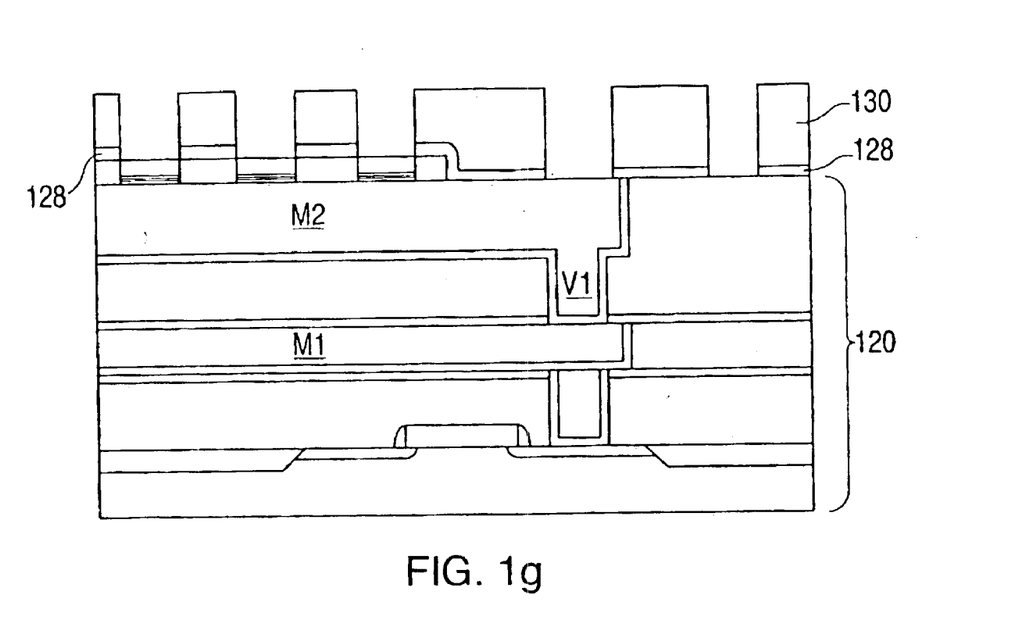
Figure 1H:
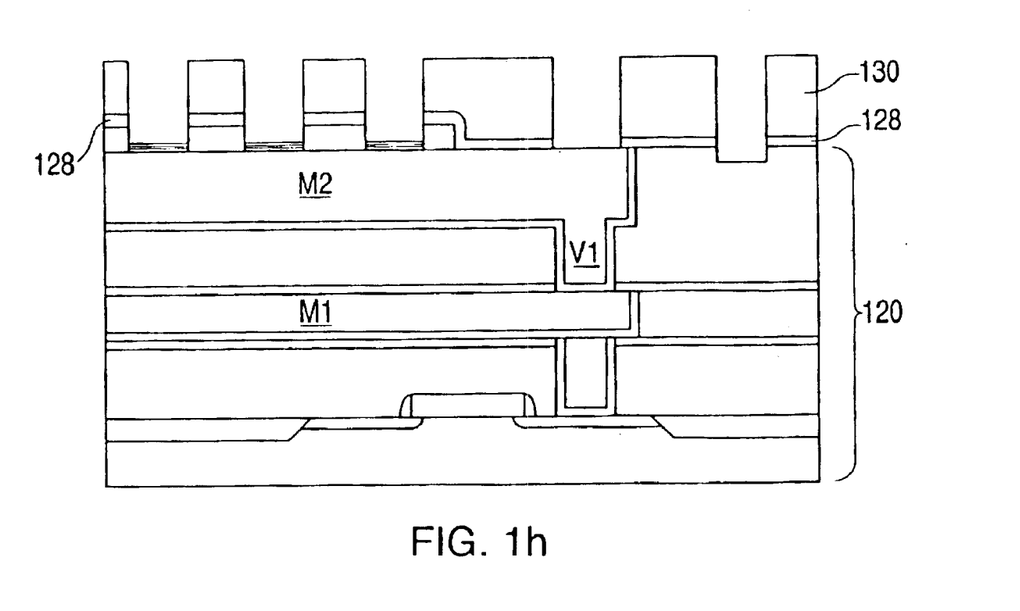
Figure 1I:
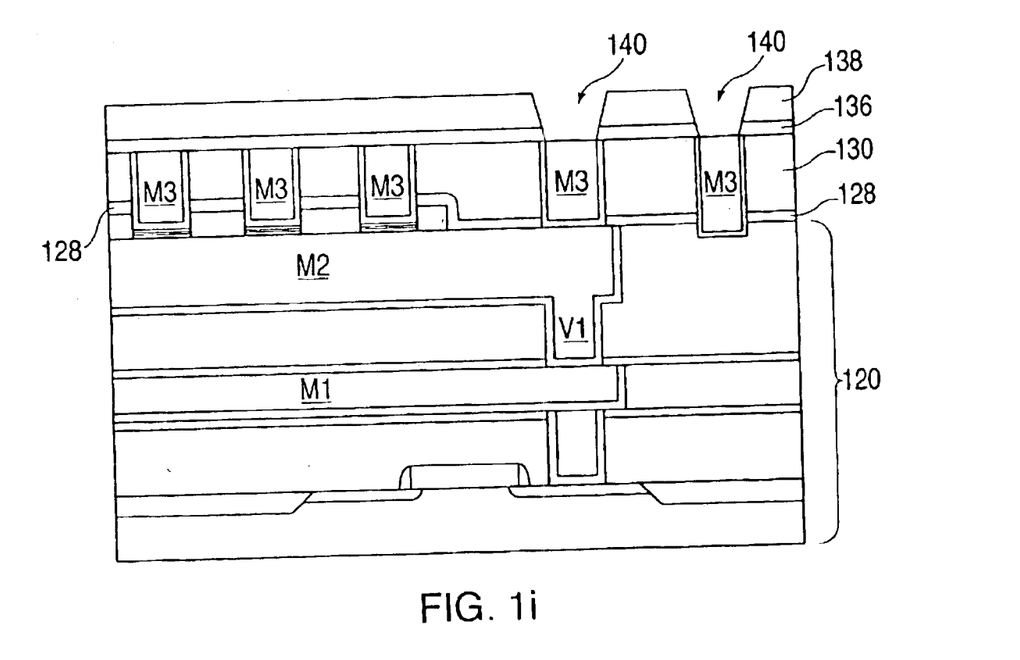

As shown in FIG. 1(f), due to the non-planarity (step height) of the protected array area, the oxide layer 130 must then be planarized with an additional step, such as by chemical mechanical polishing (CMP), before a new layer of resist 132 is deposited, patterned and etched to form the openings 134 for the third metallization layer. Once the openings 134 are formed, the exposed portions of nitride layer 128 are removed, as shown in FIG. 1(g). Then, in FIG. 1(h), the protective hardmask of the MTJ stacks are etched away, wherein it will be noted that a corresponding portion of the ILD 116 in the non-array section to the right of M2 and V1 is also etched during this step. Finally, FIG. 1(i) illustrates the formation of the M3 wiring level, which runs orthogonal to the M2 wiring in the MRAM device. The M3 liner, as well as the metal material (e.g., copper) is deposited and planarized in a conventional fashion, after which final oxide and nitride layers 136, 138 are formed to provide isolation from the final BEOL wiring out of the device. Access to the third metallization lines M3 is provided in the non-array region through openings 140 etched within layers 136 and 138.

Because of the presence of the MTJ stacks 122 in conventional, array protected MRAM processing, an extra planarization step results in additional cost and complexity in the fabrication of the device. In addition, the step height from the array protection sequence becomes even more pronounced with a multi-stack MRAM configuration, likely incurring additional fabrication yield loss and possibly making the process incompatible with ILD materials that are difficult to planarize.

Figure 2A:
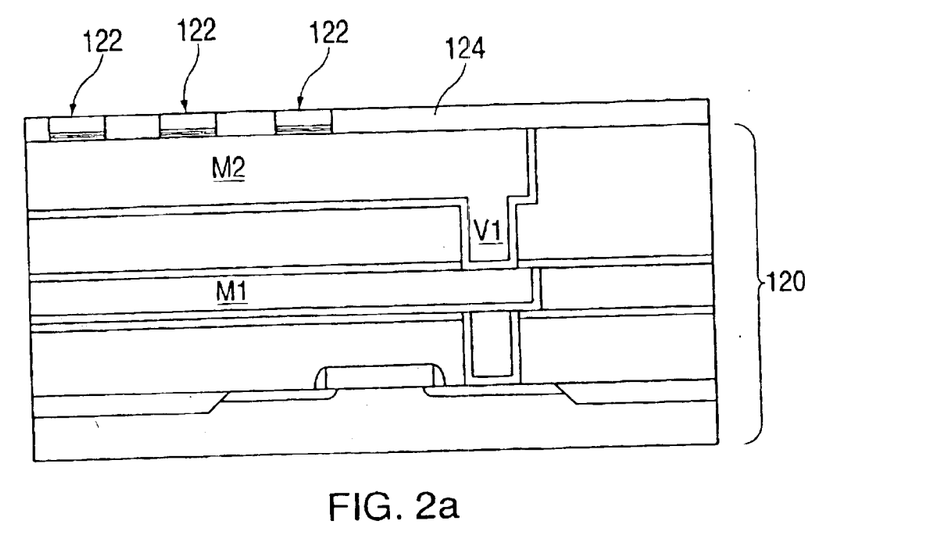
FIGS. 2(a) through 2(d) illustrate a maskless array protection method for implementing via integration following the formation of the MTJ stacks of an MRAM device, in accordance with an embodiment of the invention.
Figure 2B:
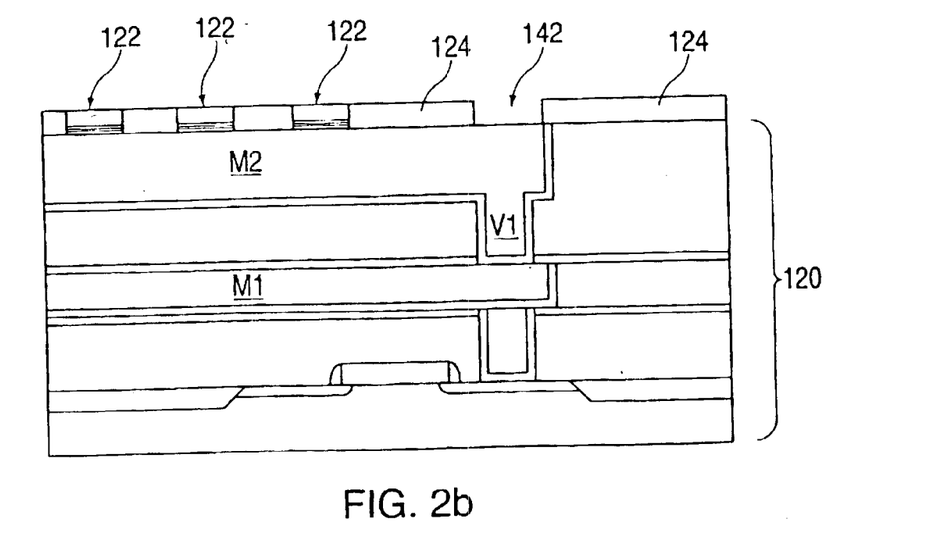
Figure 2C:
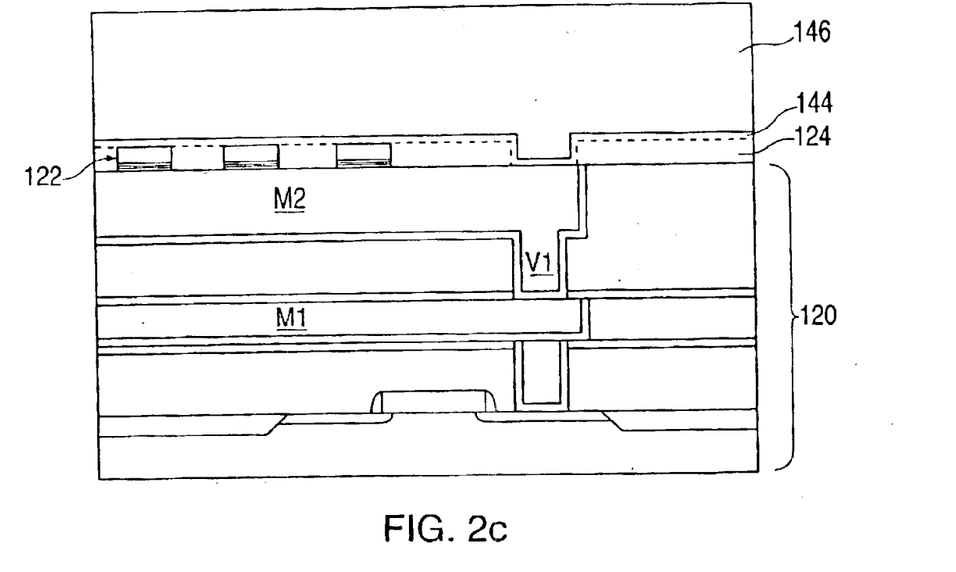
Figure 2D:
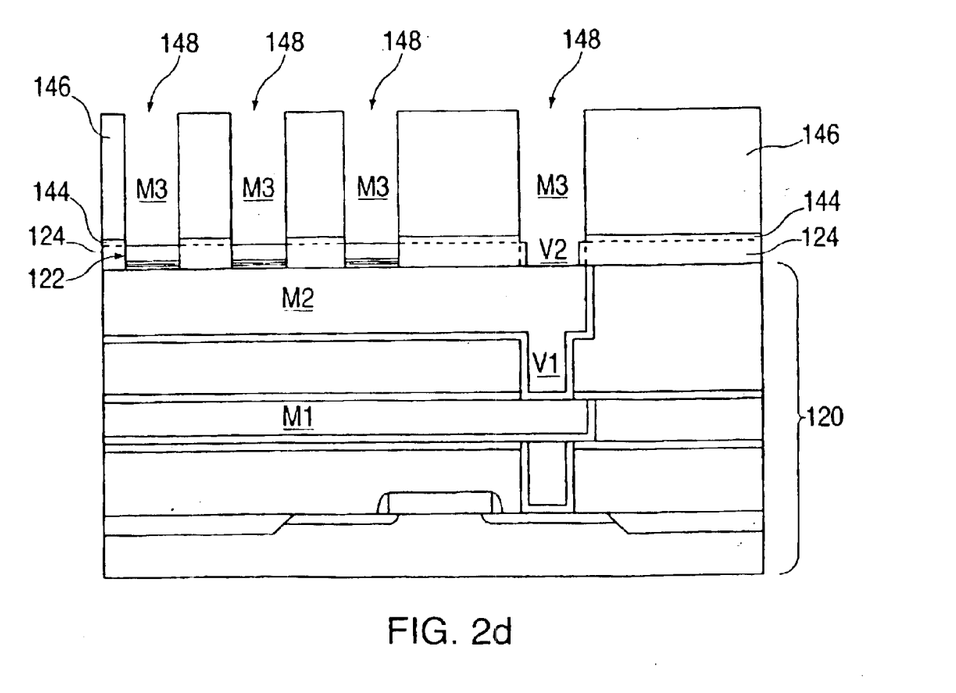
Figure 3A:
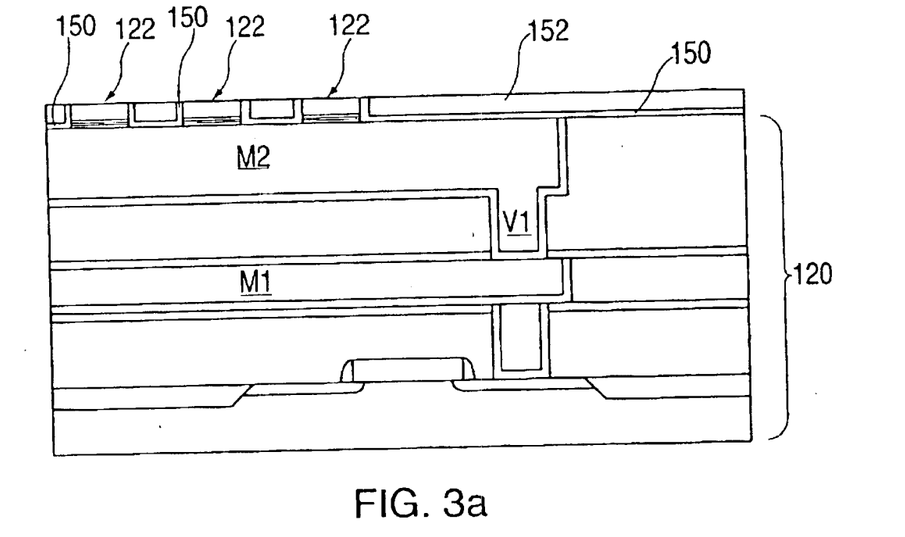
FIGS. 3(a) through 3(e) illustrate another maskless array protection method for implementing via integration following the formation of the MTJ stacks of an MRAM device, in accordance with an alternative embodiment of the invention.
Figure 3B:
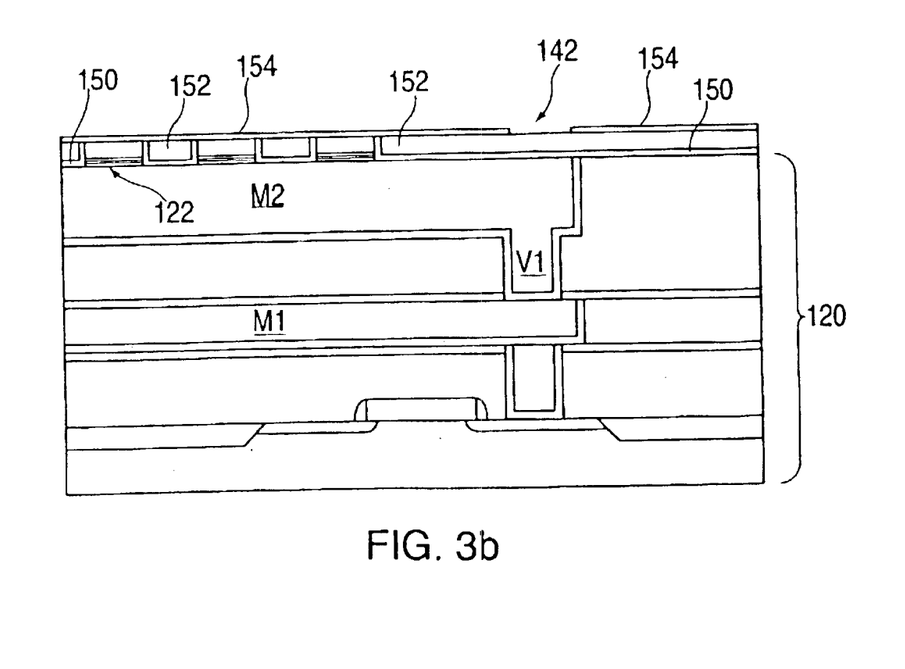
Figure 3C:
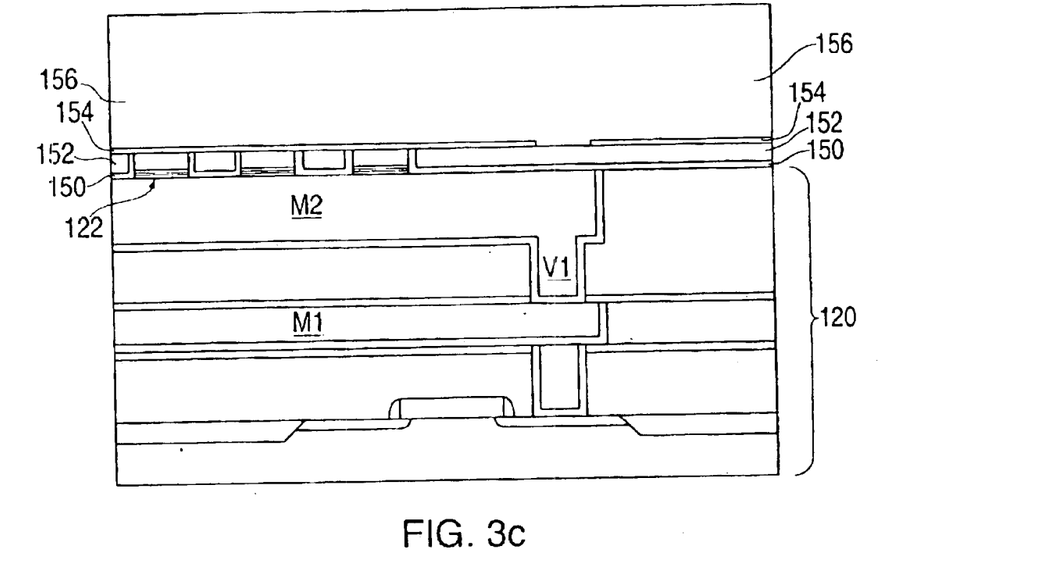
Figure 3D:
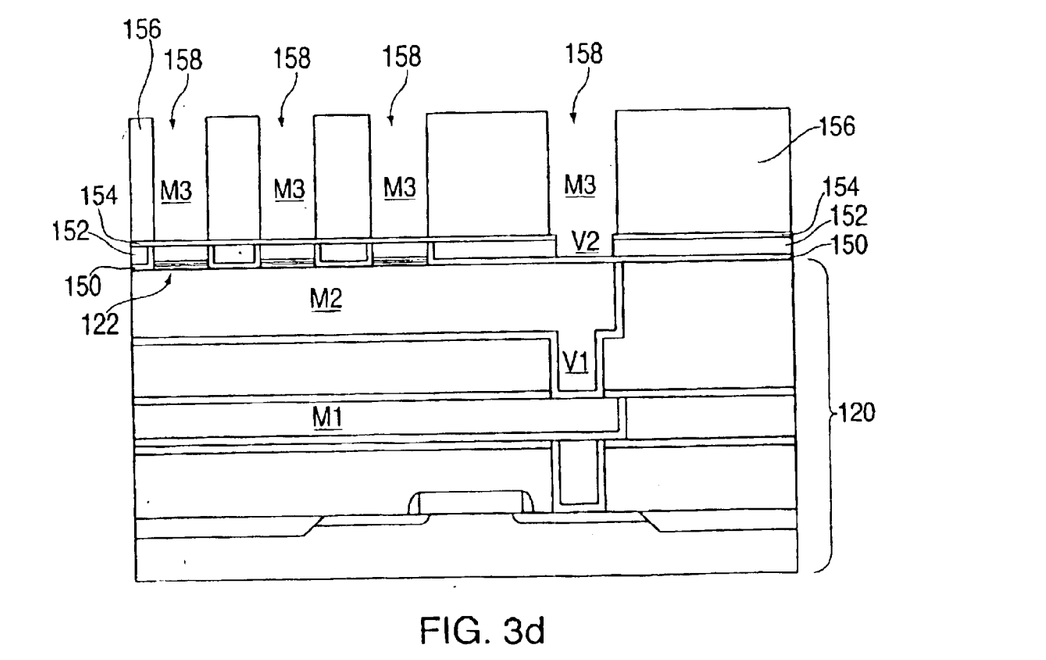
Figure 3E:
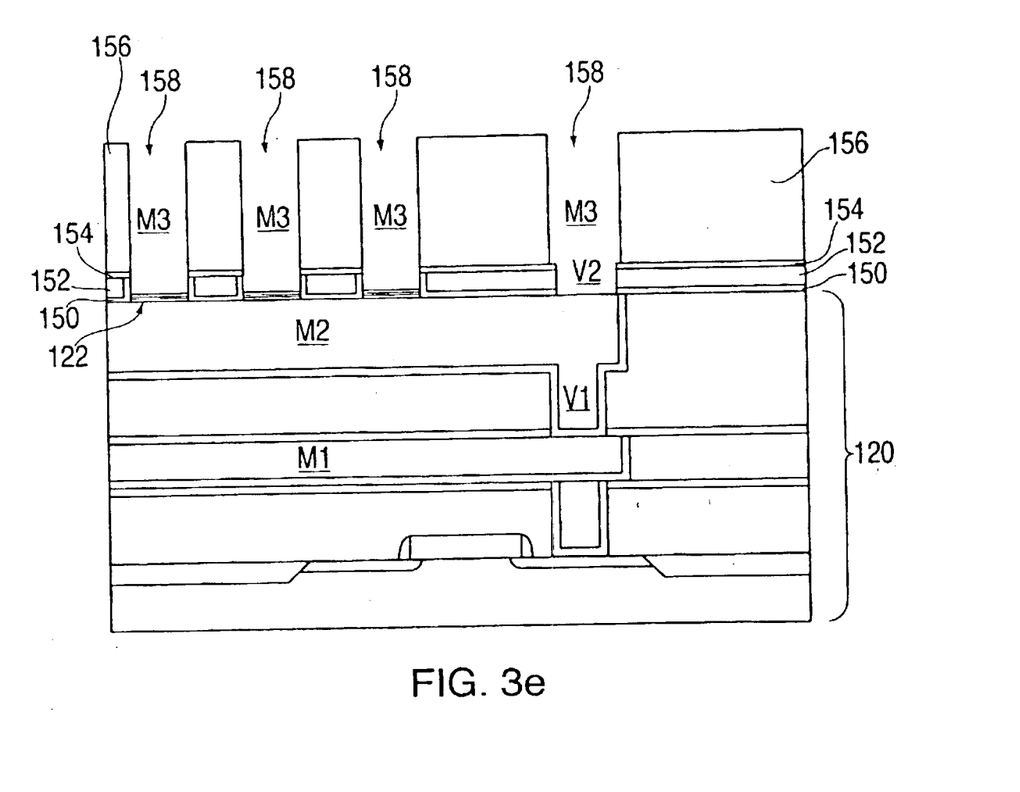

Therefore, in accordance with an embodiment of the invention, there is disclosed a maskless array protection method for implementing via integration following the formation of the MTJ stacks of an MRAM device. Referring now to FIG. 2(*a*), there is shown the MRAM device 200 at the same stage of processing as was the conventionally fabricated device 100 in FIG. 1(*d*). However, whereas the conventional processes utilize a lithography step and RIE process to remove the MTJ stack encapsulating dielectric 124 in the support regions outside the array, this embodiment utilizes a lithography step and RIE process to first form via openings in the encapsulating dielectric 124. The example herein particularly illustrates a second level via V2 (in the non-array area of MRAM device 200) to connect M2 to a subsequently formed M3 level. FIG. 2(*b*) depicts the lithography and reactive ion etching (RIE) of encapsulating dielectric (e.g., nitride layer) 124 to form a patterned opening 142 that will later define V2.

Then, in FIG. 2(*c*), an additional nitride layer 144, used to protect the bottom M2 metal surface, is deposited over the existing nitride layer 124 (now indicated in dashed lines), the MTJ stacks 122 and the exposed portion of M2 in the V1 opening. This is followed by a blanket deposition of an ILD layer 146 (for example, silicon dioxide) atop the nitride layer 144. Because there is no step height created as a result of removal of nitride in the vicinity of the array region, the ILD layer 146 is formed with sufficient planarity so as to not require an additional planarization step. This simplifies the MRAM fabrication process, thereby improving fabrication yield and production cost.

Lastly, in FIG. 2(*d*), the formation of the openings for the third metallization layer M3 is illustrated. Appropriate openings 148 over the array and over V2 are patterned and etched for a subsequent formation of damascene metal wiring features. Once the openings 148 in the ILD layer 146 are etched, a subsequent etch is used to remove the exposed portions of nitride layer 144. It will be noted that the anisotropic etch of nitride layer 144 will result in a negative RIE bias of the V2 feature relative to the M3 opening thereabove. Following the completion of the nitride etch, the hardmask layers atop the MTJ stacks 122 may be removed (not shown), and the third metallization layer may be deposited in accordance with conventional damascene/dual-damascene processing techniques.

FIGS. 3(*a*)–3(*e*) illustrate an alternative embodiment of a maskless array protection method for implementing via integration following the formation of the MTJ stacks of an MRAM device array. Referring now to FIG. 3(*a*), there is shown the MRAM device 200 at the same stage of processing as was the conventionally fabricated device 100 in FIG. 1(*d*). However, instead of utilizing a nitride dielectric 124 to encapsulate the MRAM device stacks 122, this embodiment initially features a thin passivation layer 150, followed by an encapsulating dielectric 152. The passivation layer 150 may include, but is not limited to, material such as alumina, silicon carbide or any other material suitable for providing a stable mechanical and electrical interface to the MTJ barrier sidewall and metal wiring conductor surface. The encapsulating dielectric 152 may include silicon dioxide, doped glass, or a spin-on material. This provides a method for MRAM device stack sidewall passivation and metal wiring passivation using passivation layer 150 separately from the encapsulating dielectric 152. If a spin-on material is used for the encapsulating dielectric 152, the application thereof might result in sufficient planarity to the top of the MTJ stacks. Otherwise, an additional planarization step may be implemented to adjust the height of the encapsulating dielectric 152 to the top of the MTJ stacks 122, as shown in FIG. 3(*a*).

Next, FIG. 3(*b*) illustrates a thin dielectric mask layer 154 blanket deposited onto the planarized encapsulating dielectric 152 and MTJ stacks 122. The dielectric mask layer 154 may include silicon carbide or silicon nitride, for example, such that it enables etch selectivity to the encapsulating dielectric material 152. In contrast to a conventional process, wherein a lithography step and RIE process are used to remove the MTJ stack encapsulating nitride dielectric in the support regions outside the array, this embodiment also utilizes a lithography step and RIE process to form via openings 142 prior to the deposition of the main interlevel dielectric thereupon. It will be noted, however, that via opening 142 is only formed through the dielectric mask layer 154.

As shown in FIG. 3(*c*), a blanket deposition of an ILD layer 156 (for example, silicon dioxide) atop the dielectric mask layer 154 results in a buried mask layer 154 that will be used to further etch the via openings to the passivation layer 150 covering the MRAM device stacks and bottom metal wiring level M2. Because there is essentially no step height created as a result of removal of nitride outside of the array region, as in prior art, the ILD layer 156 is formed with sufficient planarity so as not require an additional planarization step. This simplifies the MRAM fabrication process, thereby improving fabrication yield and production cost.

FIG. 3(*d*) illustrates the formation of the openings for the third metallization layer M3. Appropriate openings 158 over the array and over V2 are patterned and etched for a subsequent formation of damascene metal wiring features. Finally, in FIG. 3(*e*), once the openings 158 in the ILD layer 156 are etched, a subsequent etch is used to remove the exposed portions of buried mask layer 154 that cover the MTJ stacks 122 and the exposed portions of the passivation layer 150 covering the V2 contact to the M2 wiring surface. Following the completion of the mask etch, the hardmask layers atop the MTJ stacks 122 may be removed, and the third metallization layer (not shown) may be deposited in accordance with conventional damascene/dual damascene processing techniques.

As will be appreciated by the above described maskless array protection process, a global planarity is achieved by first defining the vias that connect M2 to M3 or, more generally, the vias that connect a lower metallization level (where the bottom layer of the MTJ stack is contacted) to an upper metallization level (where the top layer of the MTJ stack is contacted). Thus, when the subsequent nitride and ILD oxide layers are formed, sufficient planarity is maintained for the damascene processing, which eliminates the need for an additional dielectric planarization step. The M3 wiring, now independent of the M2 wiring outside the array alleviates a previous drawback of shorting of the M3 wiring to the M2 wiring. Furthermore, the elimination of the dielectric removal outside of the array is expected to show substantial yield improvement through lower foreign material and contamination of the exposed copper wiring surface. Although the exemplary embodiments illustrated herein have been described with reference to a cross-point (XPC) MRAM cell, it will be appreciated that the methods are equally applicable to FET MRAM cell configurations as well.

While the invention has been described with reference to a preferred embodiment or embodiments, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the particular embodiment disclosed as the best mode contemplated for carrying out this invention, but that the invention will include all embodiments falling within the scope of the appended claims.

What is claimed is:

1. A method for forming interconnect structures in a magnetic random access memory (MRAM) device, the method comprising:
   defining an array of magnetic tunnel junction (MTJ) stacks over a lower metallization level;
   forming an encapsulating dielectric layer over said array of MTJ stacks and said lower metallization level;
   defining a via opening in said encapsulating dielectric layer;
   depositing a planar interlevel dielectric (ILD) layer over said encapsulating dielectric layer and within said via opening; and
   forming openings within said planar ILD layer and over said array of MTJ stacks and over said via opening.

2. The method of claim 1, wherein said encapsulating dielectric layer is a nitride layer.

3. The method of claim 1, wherein said planar ILD layer has an etch selectivity with respect to said encapsulating dielectric layer.

4. The method of claim 1, further comprising forming an upper metallization level by filling said openings within said planar ILD layer and said via opening, and without implementing a planarizing step on said planar ILD layer prior thereto.

5. The method of claim 4, wherein said upper metallization level, and a via connecting said upper and lower metallization levels, are formed by dual damascene processing.

6. The method of claim 4, wherein said lower metallization level is a second metallization level (M2) within the MRAM device, and said upper metallization level is a third metallization level (M3) within the MRAM device.

7. The method of claim 4, further comprising removing a hardmask layer from said MTJ stacks prior to forming said upper metallization level.

8. A method for forming back end of line (BEOL) interconnect structures in a magnetic random access memory (MRAM) device, the method comprising:
   defining an array of magnetic tunnel junction (MTJ) stacks over a lower metallization level;
   forming a first dielectric layer over said array of MTJ stacks and said lower metallization level, and thereafter planarizing said first dielectric layer down to a top of said MTJ stacks;
   defining a via opening in said first dielectric layer, thereby exposing a portion of said lower metallization level;
   forming a second dielectric layer over said first dielectric layer and over said exposed portion of said lower metallization level;
   depositing a planar interlevel dielectric (ILD) layer over said second dielectric layer; and
   forming openings within said planar ILD layer and over said array of MTJ stacks and over said via opening.

9. The method of claim 8, further comprising forming an upper metallization level by filling said openings within said planar ILD layer and said via opening, and without implementing a planarizing step on said planar ILD layer prior thereto, wherein a via is also formed by filling said via opening, said via connecting said upper and lower metallization levels.

10. The method of claim 9, wherein said lower metallization level is a second metallization level (M2) within the MRAM device, and said upper metallization level is a third metallization level (M3) within the MRAM device.

11. The method of claim 9, wherein said lower metallization level is a second metallization level (M2) within the MRAM device, and said upper metallization level is a third metallization level (M3) within the MRAM device.

12. The method of claim 9, further comprising removing a hardmask layer from said MTJ stacks prior to forming said upper metallization level.

13. A method for forming back end of line (BEOL) interconnect structures in a magnetic random access memory (MRAM) device, the method comprising:
   defining an array of magnetic tunnel junction (MTJ) stacks over a lower metallization level;
   forming a passivation layer over said array of MTJ stacks and said lower metallization level;
   forming an encapsulating dielectric layer over said passivation layer, said encapsulating dielectric layer and said passivation layer planarized to a top of said MTJ stacks;
   forming a dielectric mask layer over said passivation layer, said encapsulating dielectric layer and said MTJ stacks;
   defining a via opening in said dielectric mask layer, thereby exposing a portion of said encapsulating dielectric layer;
   depositing a planar interlevel dielectric (ILD) layer over said dielectric mask layer; and
   forming openings within said planar ILD layer and over said array of MTJ stacks and over said via opening.

14. The method of claim 13, further comprising forming an upper metallization level by filling said openings within said planar ILD layer and said via opening, and without implementing a planarizing step on said planar ILD layer prior thereto, wherein a via is also formed by filling said via opening, said via connecting said upper and lower metallization levels.

15. The method of claim 14, wherein said upper metallization level, and said via connecting said upper and lower metallization levels, are formed by dual damascene processing.

16. The method of claim 14, wherein said lower metallization level is a second metallization level (M2) within the MRAM device, and said upper metallization level is a third metallization level (M3) within the MRAM device.

17. The method of claim 14, further comprising removing a hardmask layer from said MTJ stacks prior to forming said upper metallization level.

18. The method of claim 14, further comprising removing an exposed portion of said passivation layer prior to forming said via and said upper metallization level.

19. The method of claim 13, wherein said passivation layer comprises one of: alumina, silicon carbide and silicon nitride.

20. The method of claim 19, wherein said dielectric mask layer comprises one of: alumina, silicon carbide and silicon nitride.

* * * * *